United States Patent
Chiu et al.

(10) Patent No.: US 9,472,721 B2
(45) Date of Patent: Oct. 18, 2016

(54) EPITAXIAL SUBSTRATE, METHOD OF MANUFACTURING THE EPITAXIAL SUBSTRATE AND LIGHT EMITTING DIODE HAVING EPITAXIAL SUBSTRATE

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/836,147

(22) Filed: Aug. 26, 2015

(65) Prior Publication Data

US 2016/0064606 A1    Mar. 3, 2016

(30) Foreign Application Priority Data

Sep. 2, 2014  (CN) .......................... 2014 1 0441892

(51) Int. Cl.
| | |
|---|---|
| *H01L 33/22* | (2010.01) |
| *H01L 21/02* | (2006.01) |
| *C30B 29/00* | (2006.01) |
| *H01L 33/12* | (2010.01) |
| *H01L 33/00* | (2010.01) |
| *H01L 33/32* | (2010.01) |

(52) U.S. Cl.
CPC .............. *H01L 33/22* (2013.01); *C30B 29/00* (2013.01); *H01L 21/0242* (2013.01); *H01L 21/0243* (2013.01); *H01L 21/0254* (2013.01); *H01L 21/02458* (2013.01); *H01L 21/02502* (2013.01); *H01L 33/12* (2013.01); *H01L 33/007* (2013.01); *H01L 33/32* (2013.01)

(58) Field of Classification Search
CPC ...... H01L 33/22; H01L 33/32; H01L 33/007
See application file for complete search history.

(56) References Cited

U.S. PATENT DOCUMENTS

| | | | |
|---|---|---|---|
| 7,999,272 B2* | 8/2011 | Kim ........................ | H01L 33/22 257/103 |
| 2009/0032835 A1* | 2/2009 | Park .................... | H01L 33/0079 257/103 |
| 2009/0114933 A1* | 5/2009 | Osawa .................... | H01L 33/22 257/96 |

(Continued)

FOREIGN PATENT DOCUMENTS

| | | |
|---|---|---|
| TW | 201013987 A1 | 4/2010 |
| TW | 201344959 A | 11/2013 |

*Primary Examiner* — Joseph C Nicely
(74) *Attorney, Agent, or Firm* — Zhigang Ma

(57) ABSTRACT

An epitaxial substrate for growing a lighting emitting structure of a light emitting diode, includes a transparent base, a first buffer layer and a second buffer layer formed on the transparent base. The transparent base includes a first surface and a second surface opposite to the first surface. Plural protrusions are formed on the first surface of the transparent base. Each first buffer layer is formed on the outer surfaces of the plural protrusions. The second buffer layer fills in the recesses defined between two adjacent protrusions, and covers the first buffer layer. The refractive index of the first buffer layer is larger than that of the transparent base, and is less than that of the second buffer layer. This disclosure also relates a method for manufacturing the epitaxial substrate and a light emitting diode having the same.

19 Claims, 12 Drawing Sheets

(56) References Cited

U.S. PATENT DOCUMENTS

| | | | |
|---|---|---|---|
| 2010/0032696 A1* | 2/2010 | Yu | H01L 33/007 257/96 |
| 2011/0012109 A1* | 1/2011 | Kryliouk | H01L 21/0237 257/49 |
| 2011/0095327 A1* | 4/2011 | Shinohara | H01L 33/16 257/98 |
| 2011/0140153 A1* | 6/2011 | Lee | H01L 21/0237 257/98 |
| 2012/0032218 A1* | 2/2012 | Choi | H01L 33/08 257/98 |
| 2012/0112188 A1* | 5/2012 | Yokoyama | H01L 21/0242 257/51 |
| 2012/0135557 A1* | 5/2012 | Okuno | H01L 21/0242 438/39 |
| 2012/0298952 A1* | 11/2012 | Hikosaka | H01L 33/20 257/13 |
| 2013/0037779 A1* | 2/2013 | Takeoka | H01L 33/025 257/13 |
| 2013/0048342 A1* | 2/2013 | Malstrom | H05K 3/44 174/250 |
| 2013/0119421 A1* | 5/2013 | Lin | H01L 33/22 257/98 |
| 2013/0161652 A1* | 6/2013 | Lin | H01L 33/22 257/79 |
| 2014/0131727 A1* | 5/2014 | Chiu | H01L 33/10 257/76 |
| 2014/0291689 A1* | 10/2014 | Chiu | H01L 33/32 257/76 |
| 2015/0041823 A1* | 2/2015 | Chiu | H01L 33/32 257/76 |
| 2015/0048380 A1* | 2/2015 | Koike | H01L 33/22 257/76 |
| 2015/0054012 A1* | 2/2015 | Chiu | H01L 33/007 257/98 |
| 2015/0062915 A1* | 3/2015 | Hussell | F21K 9/50 362/296.01 |
| 2015/0280059 A1* | 10/2015 | Kang | H01L 33/06 257/13 |
| 2016/0029485 A1* | 1/2016 | Dummer | H05K 1/181 362/382 |

* cited by examiner

EPITAXIAL SUBSTRATE, METHOD OF MANUFACTURING THE EPITAXIAL SUBSTRATE AND LIGHT EMITTING DIODE HAVING EPITAXIAL SUBSTRATE

CROSS-REFERENCE TO RELATED APPLICATIONS

This application claims priority to Chinese patent application no. 201410441892.9 filed on Sep. 2, 2014, the contents of which are incorporated by reference herein.

FIELD

The present disclosure generally relates to epitaxial substrate, a light emitting diode (LED) having the epitaxial substrate and method for manufacturing the epitaxial substrate.

BACKGROUND

In recent years, due to excellent light quality and high luminous efficiency, light emitting diodes have increasingly been used as substitutes for incandescent bulbs, compact fluorescent lamps and fluorescent tubes as light sources of illumination devices. Generally, a light emitting diode includes a substrate, an N-type semiconductor layer, an active layer and a P-type semiconductor layer arranged on the substrate in sequence. Light emitted from the active layer transmits to the outside.

BRIEF DESCRIPTION OF THE DRAWINGS

Implementations of the present technology will now be described, by way of example only, with reference to the attached figures.

DETAILED DESCRIPTION

Figure 1:
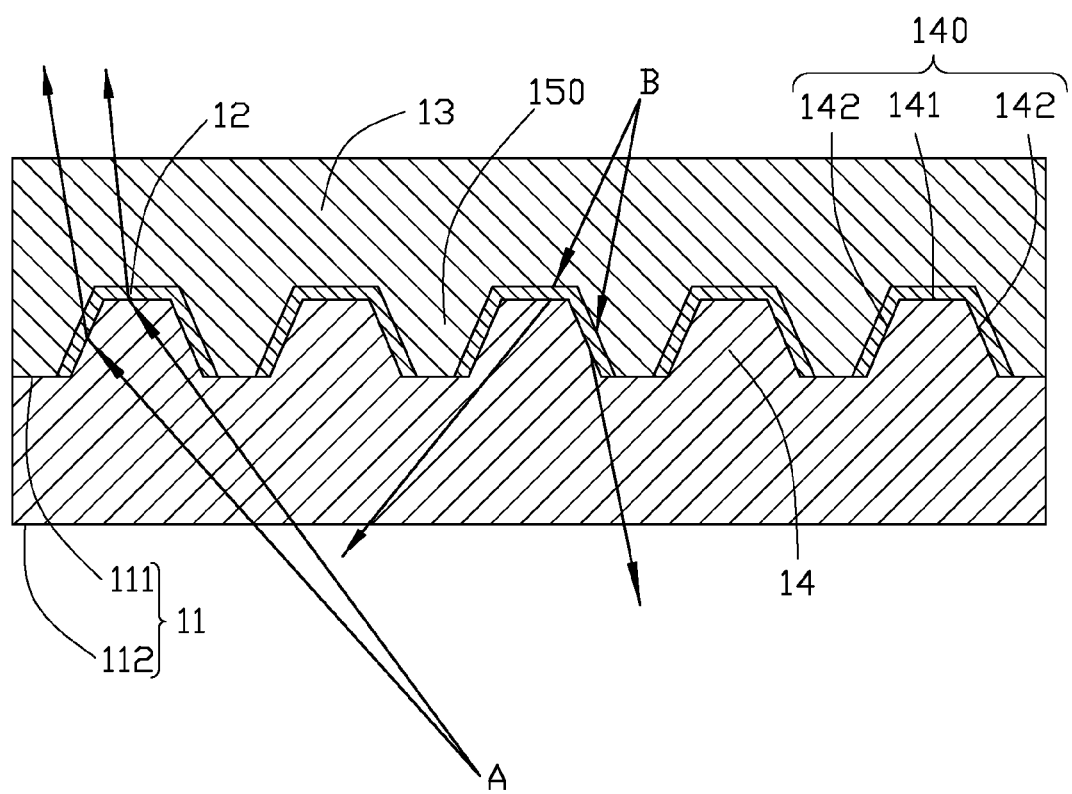
FIG. 1 is a diagrammatic, cross-sectional view of an epitaxial substrate in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

A definition that applies throughout this disclosure will now be presented.

The term "comprising," when utilized, means "including, but not necessarily limited to"; it specifically indicates open-ended inclusion or membership in the so-described combination, group, series and the like.

The present disclosure is described in relation to an epitaxial substrate, a light emitting diode having the epitaxial substrate and method for manufacturing the epitaxial substrate.

FIG. 1 illustrates that an epitaxial substrate 10 illustrate in accordance with a first embodiment of the present disclosure. The epitaxial substrate 10 is configured for growing a light emitting structure of a light emitting diode. The epitaxial substrate 10 includes a base 11, a first buffer layer 12 and a second buffer layer 13 formed on the base 11.

The base 11 includes a first surface 111 and a second surface opposite to the first surface 112. The base 11 is transparent. The base 11 preferably is a monocrystal plate and made of sapphire.

A plurality of protrusions 14 are formed on the first surface 111 of the transparent base 11. The protrusions 14 are spaced apart from each other. The protrusions 14 protrude outwardly from the first surface 111. The protrusions 14 are configured for breaching the total internal reflection occurring at the first surface 111 wherein light is incident in the transparent base 11, therefore increasing the light extraction efficiency of the transparent base 11.

A recess 150 is defined between each two adjacent protrusions 14. A width of each recess 150 gradually increases as it extends away from the first surface 111 of the transparent base 11.

In this embodiment, a cross section view of each protrusion 14 is trapezoid-shaped. Each protrusion 14 has an outer surface 140. The outer surface 140 includes a horizontal top surface 141 and two side surfaces 142 extending from two opposite lateral edges of the top surface 141 aslant and downwards to the first surface 111 of the transparent base 11. A width of each protrusion 14 gradually decreases as it extends away from the first surface 111 of the transparent base 11.

The first buffer layers 12 are formed on the base 11. Each first buffer layer 12 covers a corresponding protrusion 14. Each first buffer layer 12 is disposed on the outer surfaces 140 of the corresponding protrusion 14. A refractive ratio of the first buffer layer 12 is larger than the refractive ratio of the base 11. Each two adjacent first buffer layers 12 are formed spaced apart from each other in the recess 150 between two adjacent protrusions 14. In this embodiment, each first buffer layer 12 covers the top surface 141 and two side surfaces 142 and is in contact with the first surface 111 of the base 11, which is a bottom of each recess 150.

The first buffer layer 12 is a thin film having an even thickness. The thickness of the first buffer layer 12 can be within the range from about 10 nm to 200 nm. Preferably, the thickness of the first buffer layer about 12 is about 25 nm.

The first buffer layer 12 can be made from $Al_xGa_{1-x}N$, wherein $0<x\leq1$, or $In_yGa_{1-y}N$, wherein $0<x\leq1$, or $Al_tIn_vGa_{1-t-v}N$, wherein $0<t, v<1$, or $Al_kIn_sN$, wherein $0<k, s\leq1$. In this embodiment, the first buffer layer 12 is made from AlN.

The second buffer layer 13 fills the recesses 150 and covers the first buffer layers 12. A refractive ratio of the second buffer layer 13 is larger than the refractive ratio of the first buffer layer 12.

In the present epitaxial substrate 10, a direction of light B is from the second buffer layer 13 to the base 11. The light B is refracted three times; by the second buffer layer 13, the first buffer layer 12 and the transparent base 11 in sequence and then scattered to emit out from the second surface 112 of the base 11 at lateral sides of the base 11 when the light B travels through the second buffer layer 13, the first buffer layer 12 and the transparent base 11, because refractive ratio decreases thereamong and protrusions 14 are formed on the first surface 111 of the base 11. The light B is scattered laterally to reduce a light intensity in a middle portion of the base 11 and increase the light intensity at lateral sides thereof, thereby increasing a uniformity of the light intensity.

Contrarily, a direction of light A is from the base 11 to the second buffer layer 13. The light A is refracted three times; by the transparent base 11, the first buffer layer 12 and the second buffer layer 13 in sequence and then concentrated to emit out from the second buffer layer 13 at a middle portion thereof when the light A travels through the transparent base 11, the first buffer layer 12 and the second buffer layer 13, thereby increasing the light intensity in the middle portion of the base 11 and the uniformity of the light intensity.

Figure 2:
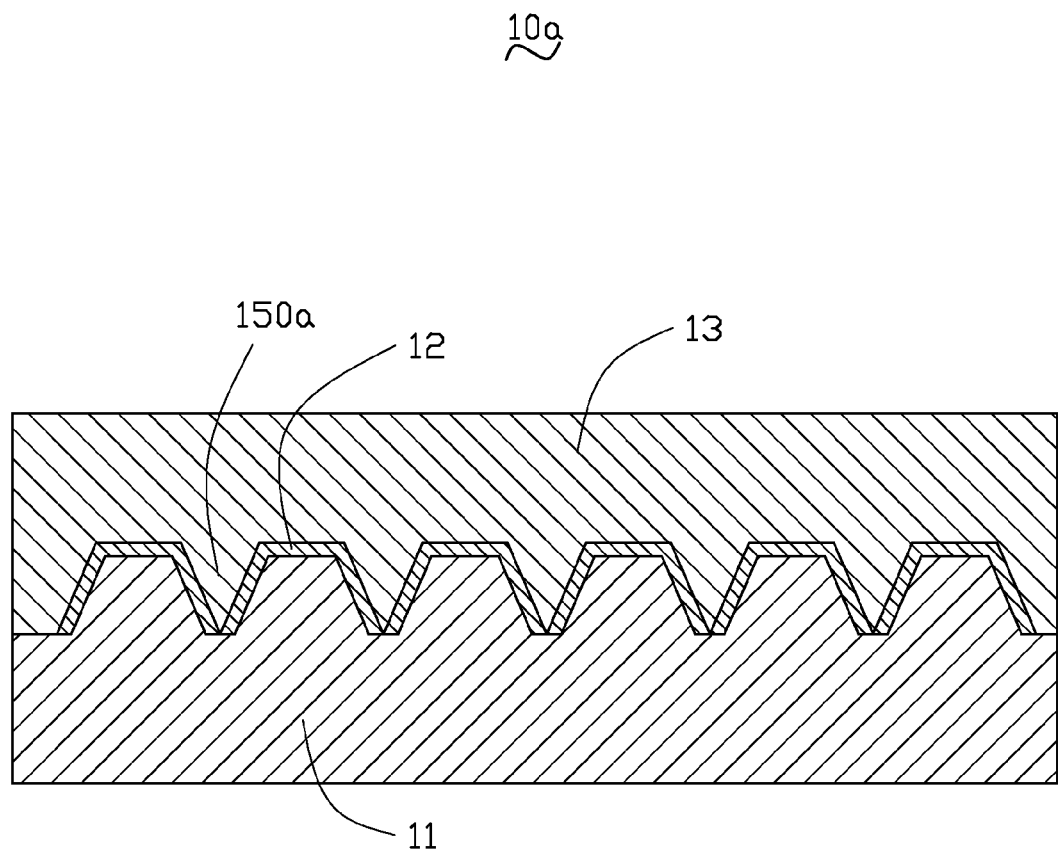
FIG. 2 is a diagrammatic, cross-sectional view of an epitaxial substrate in accordance with an exemplary embodiment of the present disclosure.

FIG. 2 illustrates that an epitaxial substrate 10a illustrate in accordance with a second embodiment of the present disclosure. A difference between the epitaxial substrate 10a of the second embodiment and the epitaxial substrate 10 of the first embodiment is that each two adjacent first buffer layers 12 are formed to be in contact with each other at the bottom of the recess 150a therebetween and cover the bottom thereof.

Figure 3:
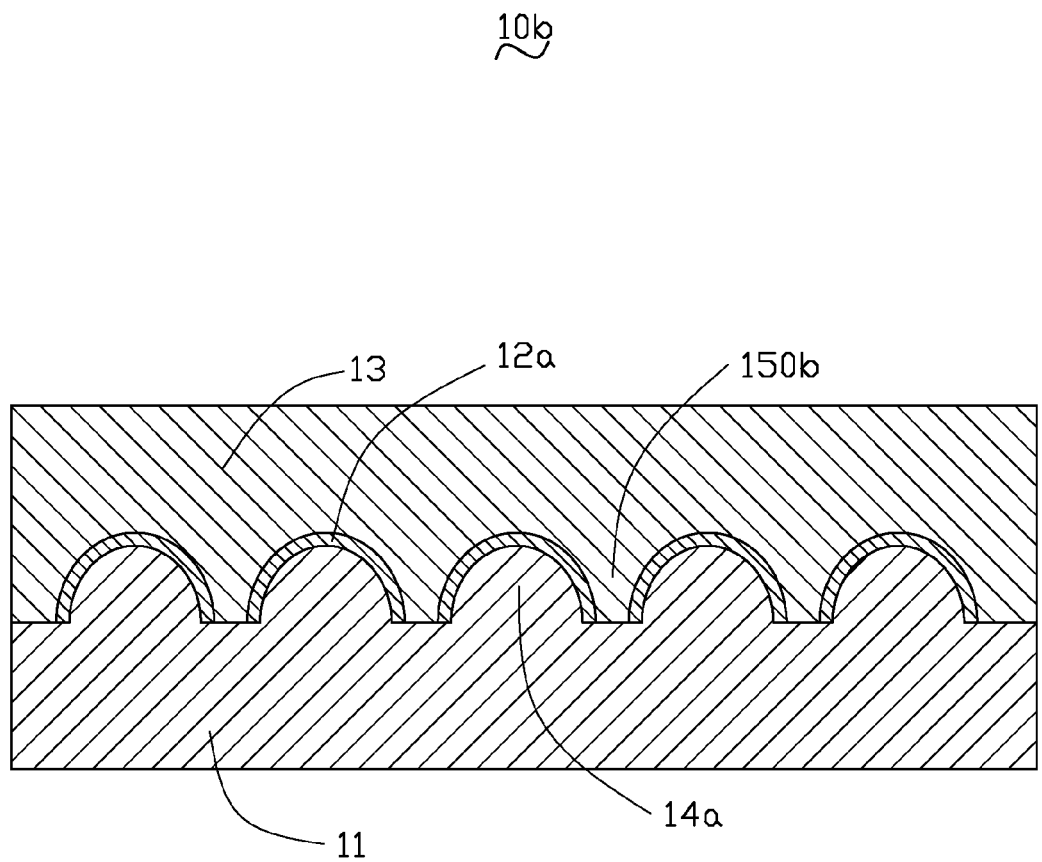
FIG. 3 is a diagrammatic, cross-sectional view of an epitaxial substrate in accordance with an exemplary embodiment of the present disclosure.

FIG. 3 illustrates that an epitaxial substrate 10b illustrate in accordance with a third embodiment of the present disclosure. A difference between the epitaxial substrate 10b of the third embodiment and the epitaxial substrate 10 of the first embodiment is that each protrusion 14a has a hemispherical-shaped cross-section. Each first buffer layer 12 covers the outer surface of a corresponding protrusion 14a. Each two adjacent first buffer layers 12a are formed to space from each other in the recess 150 between two adjacent protrusions 14a.

Figure 4:
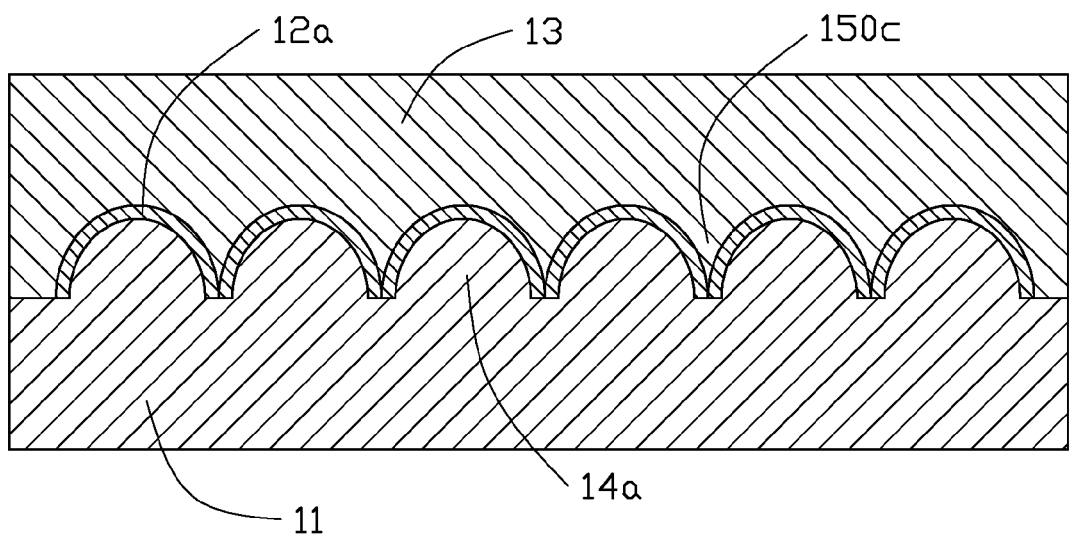
FIG. 4 is a diagrammatic, cross-sectional view of an epitaxial substrate in accordance with an exemplary embodiment of the present disclosure.

FIG. 4 illustrates that an epitaxial substrate 10c illustrate in accordance with a fourth embodiment of the present disclosure. A difference between the epitaxial substrate 10c of the third embodiment and the epitaxial substrate 10b of the third embodiment is that each two adjacent first buffer layers 12 are formed to be in contact with each other at the bottom of the recess 150c therebetween and cover the bottom thereof.

Figure 5:
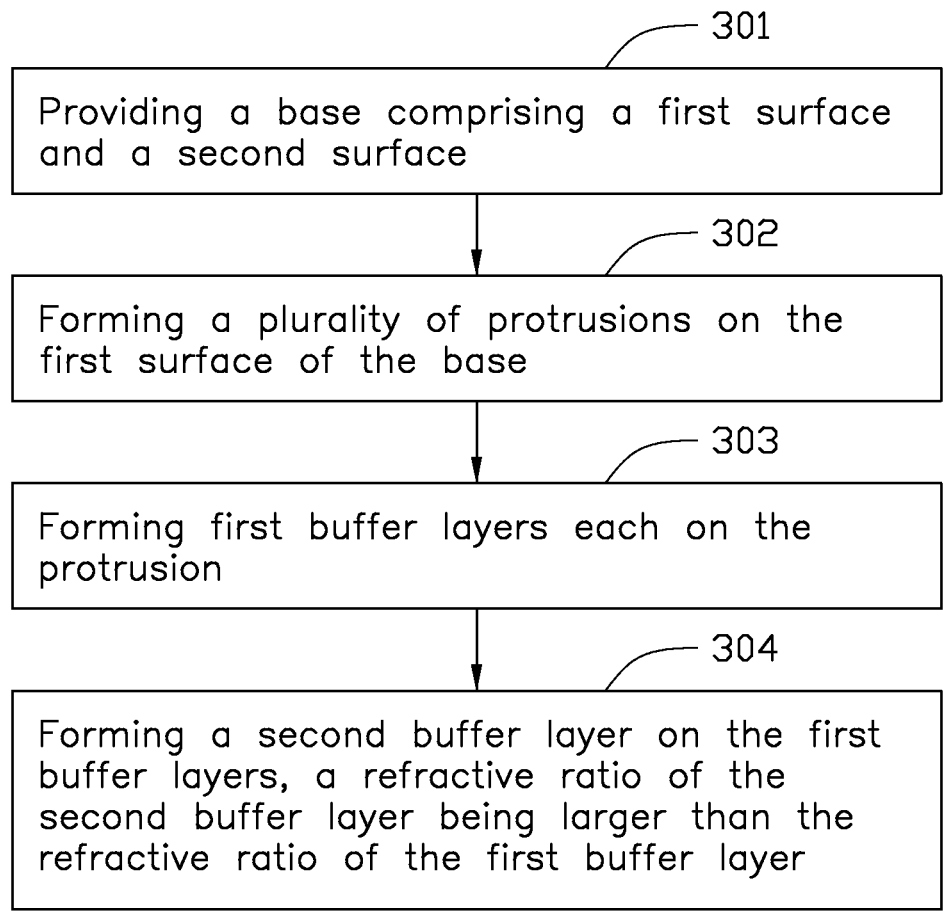
FIG. 5 is a flow chart of a method for forming an epitaxial substrate in accordance with the present disclosure.

FIG. 5 illustrates a flow chart of a method for forming an epitaxial substrate in accordance with the embodiment of the present disclosure. The example method is provided by way of example, as there are a variety of ways to carry out the method. The method described below can be carried out using the configurations illustrated in FIGS. 6-9, for example, and various elements of these figures are referenced in explaining example method. Each block shown in FIG. 5 represents one or more processes, methods or sub-routines, carried out in the example method. Additionally, the illustrated order of blocks is by example only and the order of the blocks can change according to the present disclosure. The example method can begin at block 301.

At block 301, providing a base 11 including a first surface 111 and a second surface 112.

At block 302, forming a plurality of protrusions 14 on the first surface 111 of the base 11.

At block 303, forming first buffer layers 12 each on the protrusion 14.

At block 304, forming a second buffer layer 13 on the first buffer layers 12.

Figure 6:
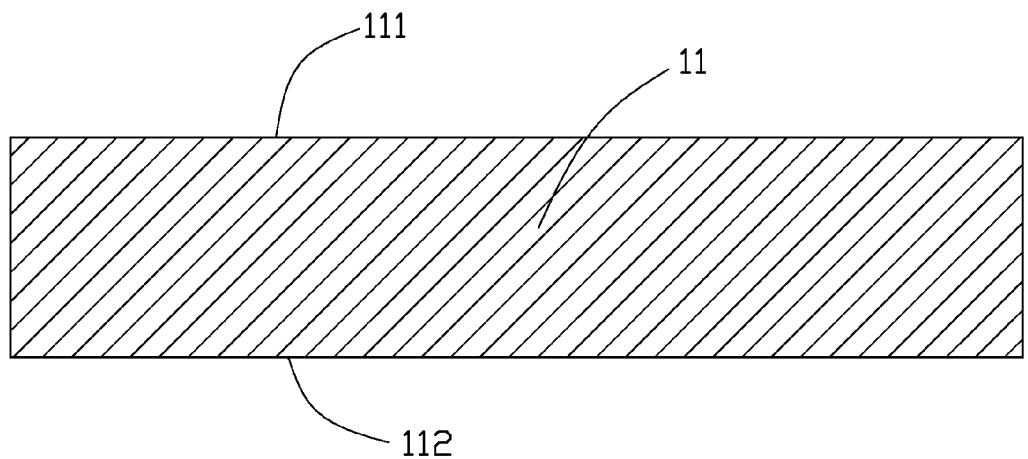
FIGS. 6-9 are diagrammatic cross sections showing an epitaxial substrate in accordance with the embodiment of the present disclosure processed by various steps of the light emitting diode method of FIG. 1.

At block 301, referring to FIG. 6, the base 11 is transparent. The base 11 preferably is a monocrystal plate and made of sapphire.

Figure 7:
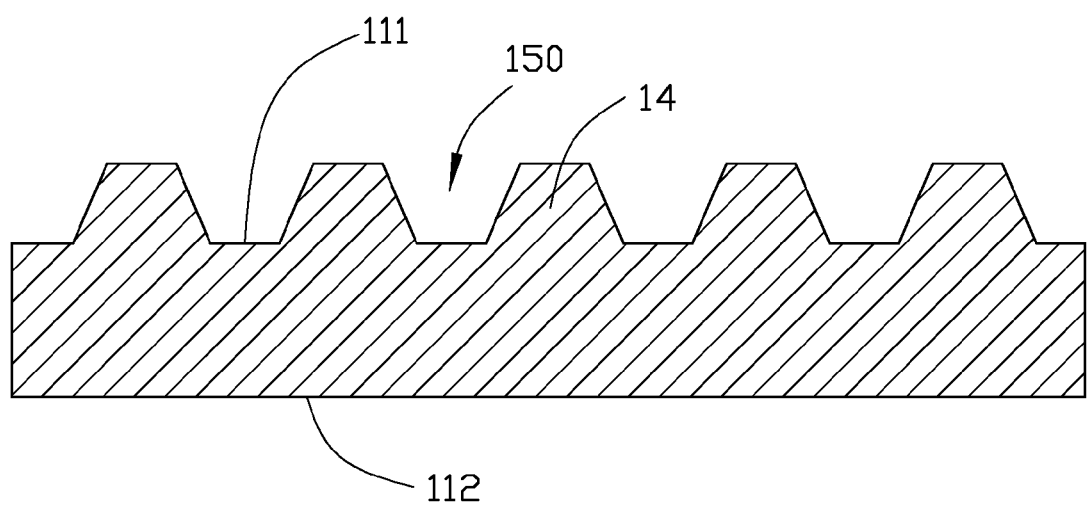

At block 302, referring to FIG. 7, the protrusions 14 are spaced apart from each other. The protrusions 14 protrude from the first surface 111 outwards. A recess 150 is defined between each two adjacent protrusions 14. The protrusions 14 can be made by etching.

Figure 8:
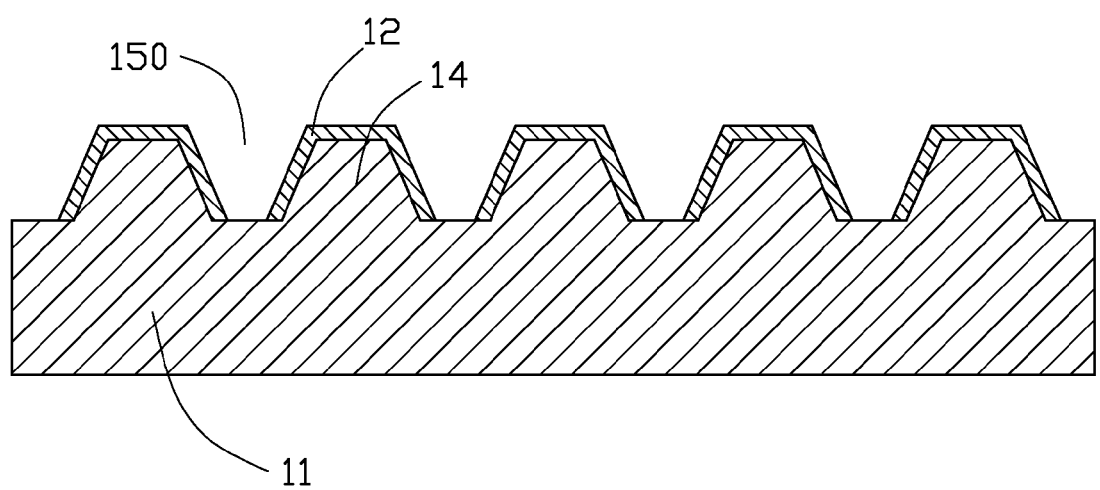

At block 303, referring to FIG. 8, each first buffer layer 12 covers a corresponding protrusion 14. Each first buffer layer 12 is disposed on the outer surfaces 140 of the corresponding protrusion 14. A refractive ratio of the first buffer layer 12 is larger than that of the base 11. The first buffer layer 12 can be made by Metal-organic Chemical Vapor Deposition (MOCVD), Radio Frequency magnetron Sputter, Chemical Vaporous Depositon (CVD), Physical Vaporous Deposition (PVD), Atomic Layer Deposition (ALD), or Molecular Beam Epitaxy (MBE). The first buffer layer 12 can be made from $Al_xGa_{1-x}N$, $0<x\leq1$; or $In_yGa_{1-y}N$, $0<x\leq1$; or $Al_tIn_vGa_{1-t-v}N$, $0<t, v<1$; or $Al_kIn_sN$, $0<k, s\leq1$. In this embodiment, the first buffer layer 12 is made from AlN. The thickness of the first buffer layer 12 can be within the range from about 10 nm to 200 nm. Specially, the thickness of the first buffer layer 12 is 25 nm. A temperature inside an oven for growing the first buffer layer 12 can be within the range from about 600° C. to 1100° C. Specially, the temperature is 900° C.

Figure 9:
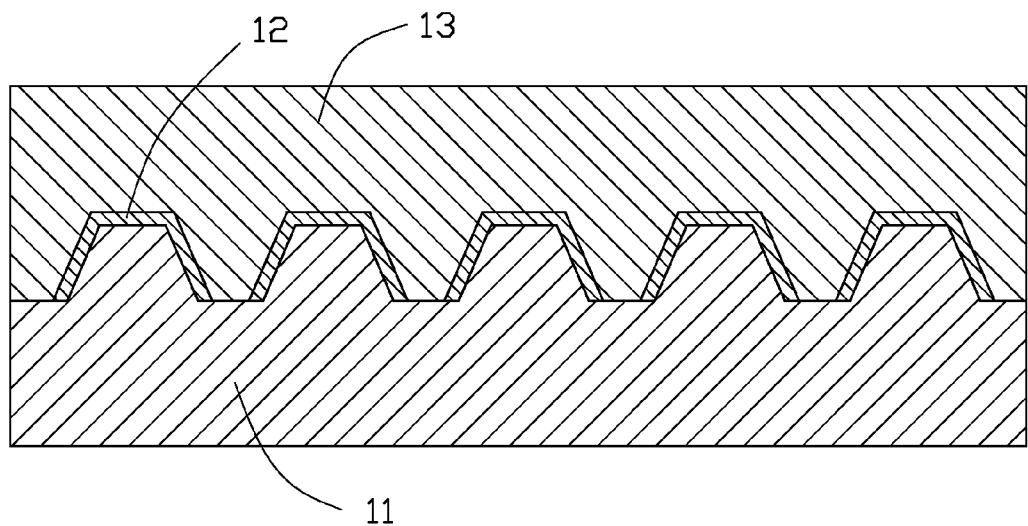

At block 304, referring to FIG. 9, the second buffer layer 13 is filled in the recesses 150 and covers the first buffer layers 12. A refractive ratio of the second buffer layer 13 is larger than the refractive ratio of the first buffer layer 12. The second buffer layer 13 can be made from an undoped GaN. And the second buffer layer 13 can be grown by the same method as the first buffer layer 12.

Figure 10:
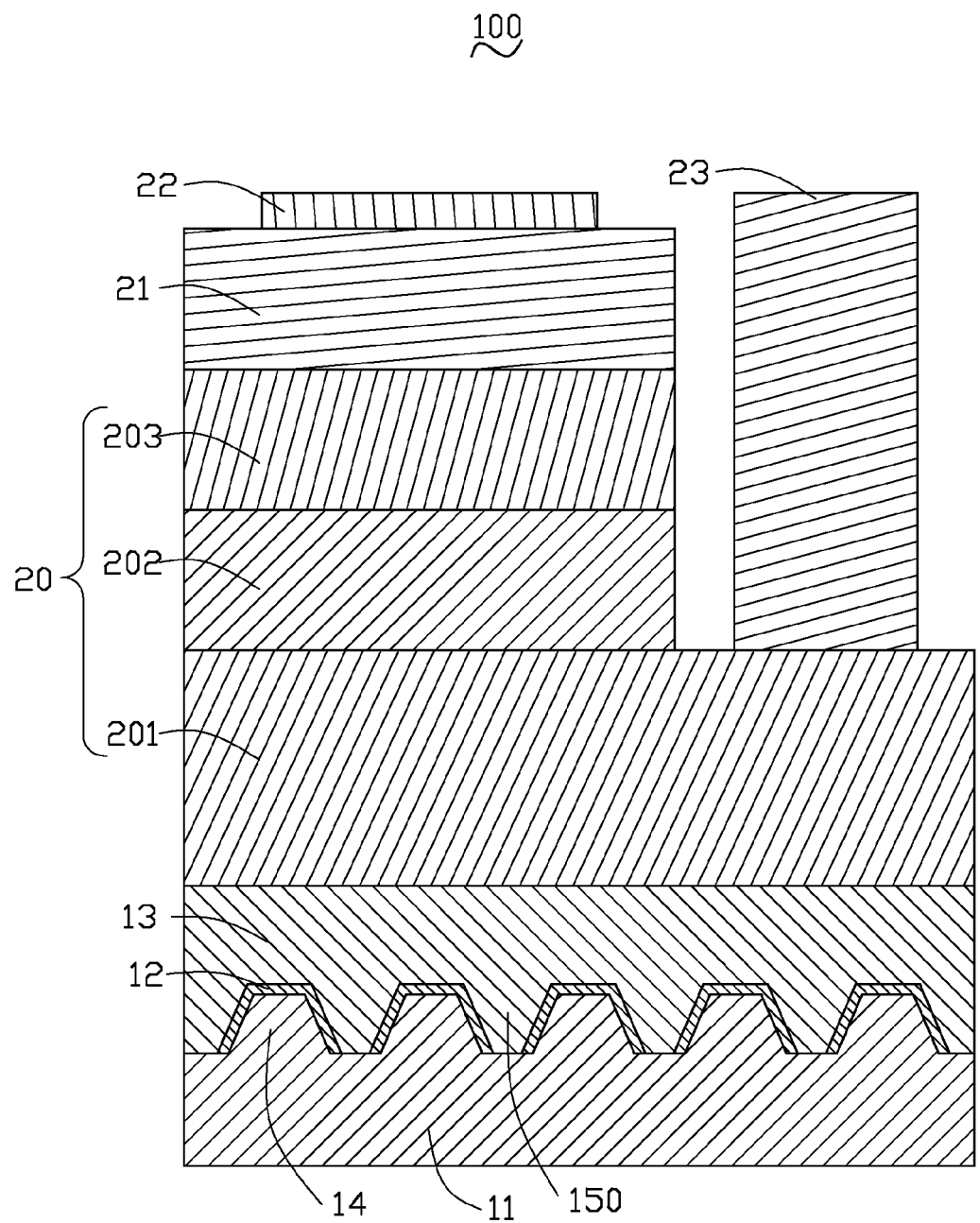
FIG. 10 is a diagrammatic, cross-sectional view of a light emitting diode having the epitaxial substrate of FIG. 1 in accordance with an exemplary embodiment of the present disclosure.

FIG. 10 illustrates a light emitting diode 100 in accordance with a first embodiment of the present disclosure. The light emitting diode 100 includes an epitaxial substrate 10, a lighting emitting structure 20, an ohmic conductive layer 21, a P type electrode 22 and an N type electrode 23.

The light emitting structure 20 is grown on a surface of the second buffer layer 13. The light emitting structure 20 includes an N type layer 201, a P type layer 203 and an active layer 202 grown between the N type layer 201 and the P type layer 203. The N type layer 201 and the P type layer 203 both can be made of AlGaN.

The ohmic conductive layer 21 is formed on the P type layer 203. The ohmic conductive layer 21 can be made of GaN. The P type electrode 22 is formed on the ohmic conductive layer 21. The N type electrode 23 is formed on N type layer 201. The N type electrode 23 is formed where a part of the N type layer 201 exposed outside, wherefore the light emitting structure 20 covering the part of the N type layer 201 is etched.

Figure 11:
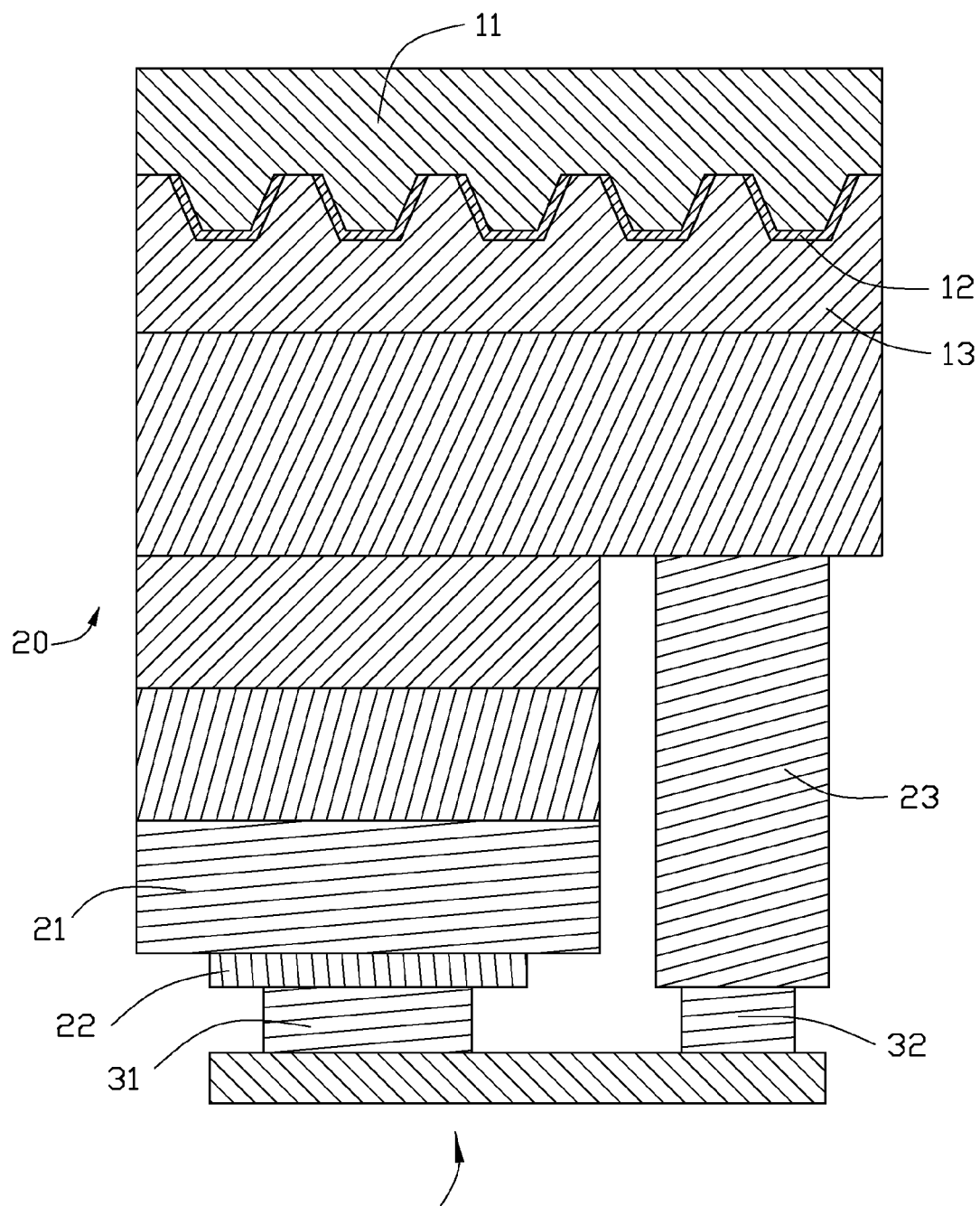
FIG. 11 is a diagrammatic, cross-sectional view of the light emitting diode of FIG. 10 mounted on a circuit board.

FIG. 11 illustrates the light emitting diode 100 mounted on a circuit board 30. The circuit board 30 includes an anode pad 31 and cathode pad 32. The anode pad 31 and the cathode pad 32 of the circuit board 30 are soldered with the P type electrode 22 and the N type electrode 23, respectively.

Figure 12:
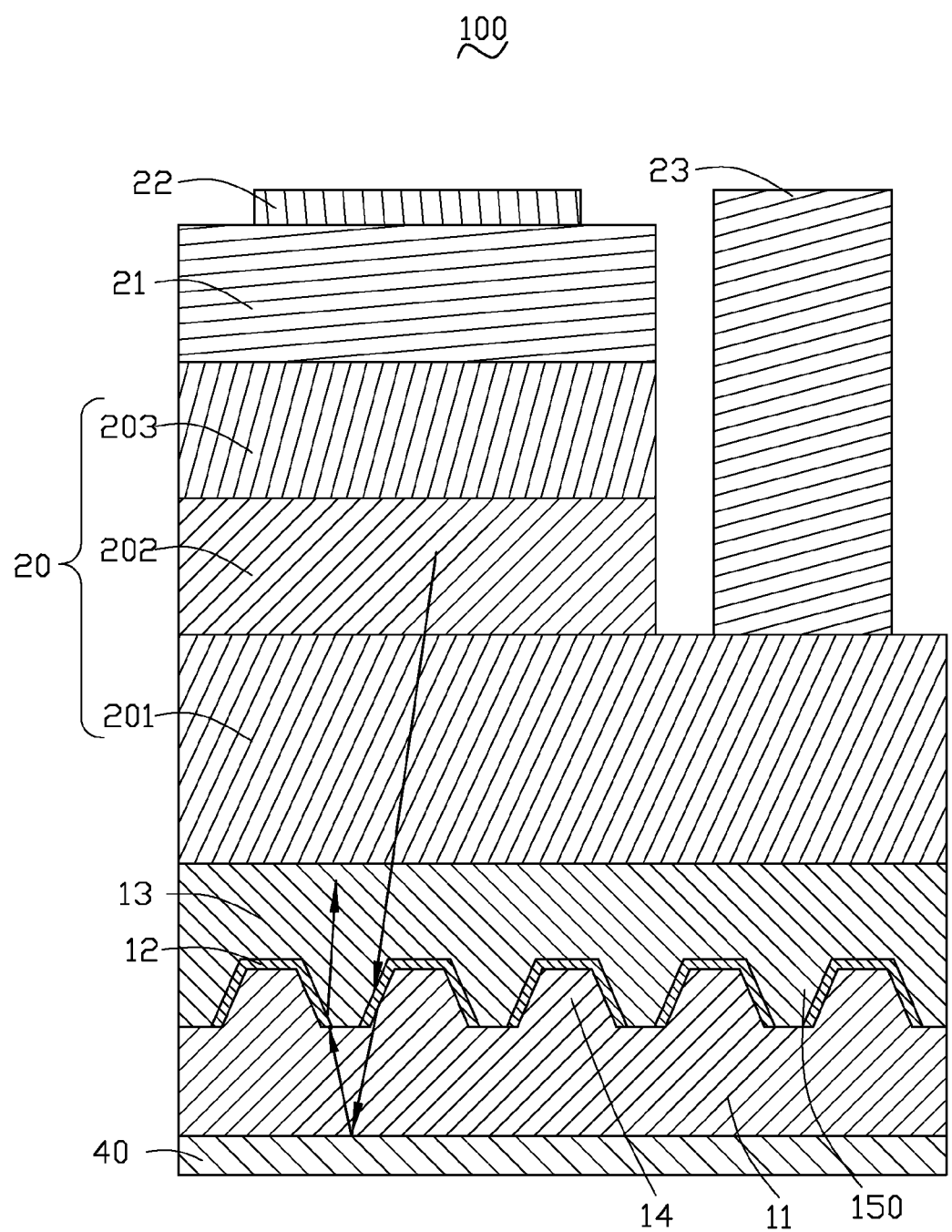
FIG. 12 is a diagrammatic, cross-sectional view of a light emitting diode having an epitaxial substrate of FIG. 1 in accordance with an exemplary embodiment of the present disclosure.

FIG. 12 illustrates a light emitting diode 100a in accordance with a second embodiment of the present disclosure. A difference between the light emitting diode 100a of the second embodiment and the light emitting diode 100 of the first embodiment is that a reflective layer 40 is formed on the second surface 112 of the transparent base 11. The reflective layer 40 is configured for reflecting light from the second surface 112 back to the second buffer layer 13. And the light travels through the transparent base 11, the first buffer layer 12 and the second buffer layer 13 in sequence, and emits from a middle portion of the light emitting diode 100a, thereby increasing the light intensity in the middle portion of the light emitting diode 100a and the uniformity of the light intensity.

It is to be further understood that even though numerous characteristics and advantages have been set forth in the foregoing description of embodiments, together with details of the structures and functions of the embodiments, the disclosure is illustrative only; and that changes may be made in detail, according in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of a light emitting diode package. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. An epitaxial substrate for growing a lighting emitting structure of a light emitting diode, the epitaxial substrate comprising:
    a base comprising a first surface and a second surface opposite to the first surface, a plurality of protrusions being formed on the first surface, a recess being defined between each two adjacent protrusions;
    a plurality of first buffer layers positioned on outer surfaces of the protrusions; and
    a second buffer layer filled in the recesses and covering the first buffer layers, a refractive ratio of the first buffer layer being larger than a refractive ratio of the base and being less than a refractive ratio of the second buffer layer;
    wherein the first buffer layers covers the protrusions and extend in the recesses, and each first buffer layer is spaced apart from an adjacent one in a corresponding recess therebetween.

2. The epitaxial substrate of claim 1, wherein the first buffer layers covers the protrusions and extend in the recesses, and each first buffer layer is in contact with an adjacent one in a corresponding recess therebetween.

3. The epitaxial substrate of claim 2, wherein each first buffer layer contacts with the corresponding adjacent one at a bottom of the corresponding recess.

4. The epitaxial substrate of claim 1, wherein the protrusions have trapezoid-shaped or hemispherical-shaped cross-sections.

5. The epitaxial substrate of claim 1, wherein the base is transparent, and the base is a monocrystal plate and made of sapphire.

6. The epitaxial substrate of claim 1, wherein the first buffer layer is made from AlN, and the second buffer layer is made from undoped GaN.

7. The epitaxial substrate of claim 6, wherein the first buffer layer is made from $Al_xGa_{1-x}N$, $0<x\leq1$, or $In_yGa_{1-y}N$, $0<x\leq1$, or $Al_tIn_vGa_{1-t-v}N$, $0<t$, $v<1$, or $Al_kIn_sN$, $0<k$, $s\leq1$.

8. The epitaxial substrate of claim 1, wherein each first buffer layer is a thin film having an even thickness, and the thickness of the first buffer layer is about 25 nm.

9. The epitaxial substrate of claim 1, wherein each first buffer layer is a thin film having an even thickness, and the thickness of the first buffer layer is within the range from about 10 nm to 200 nm.

10. A light emitting diode comprising:
    an epitaxial substrate, comprising:
        a base comprising a first surface and a second surface opposite to the first surface, a plurality of protrusions being formed on the first surface, a recess being defined between each two adjacent protrusions;
        a plurality of first buffer layers positioned on outer surfaces of the protrusions; and
        a second buffer layer filled in the recesses and covering the first buffer layers, a refractive ratio of the first buffer layer being larger than a refractive ratio of the base and being less than a refractive ratio of the second buffer layer;
    a lighting emitting structure grown on the epitaxial substrate; and
    a P type electrode and an N type electrode formed on the lighting emitting structure;
    wherein the first buffer layers covers the protrusions and extend in the recesses, and each first buffer layer is spaced apart from an adjacent one in a corresponding recess therebetween.

11. The light emitting diode of claim 10, wherein the light emitting structure comprises an N type layer, a P type layer and an active layer grown between the N type layer and the P type layer.

12. The light emitting diode of claim 11, wherein the N type layer and the P type layer are both made of AlGaN.

13. The light emitting diode of claim 11, wherein the P type electrode is formed on the P type layer, and the N type electrode is formed on N type layer.

14. The light emitting diode of claim 11, wherein the light emitting diode is mounted on a circuit board, the circuit board comprises an anode pad and cathode pad, the anode pad and the cathode pad are soldered with the P type electrode and the N type electrode, respectively.

15. A method for manufacturing an epitaxial substrate for growing a lighting emitting structure of a light emitting diode, comprising:
    providing a base comprising a first surface and a second surface;
    forming a plurality of protrusions on the first surface of the base;
    forming first buffer layers on the protrusion; and forming a second buffer layer on the first buffer layers, a refractive ratio of the second buffer layer being larger than the refractive ratio of the first buffer layer;

wherein the first buffer layers covers the protrusions and extend in the recesses, and each first buffer layer is spaced apart from an adjacent one in a corresponding recess therebetween.

16. The method of claim 15, wherein the base is transparent, and the base is a monocrystal plate and made of sapphire.

17. The method of claim 15, wherein a recess is defined between each two adjacent protrusions, and the protrusions are made by etching.

18. The method of claim 15, wherein each first buffer layer covers a corresponding protrusion, each first buffer layer is disposed on the outer surfaces of the corresponding protrusion.

19. The method of claim 15, wherein a refractive ratio of the first buffer layer is larger than the refractive ration of the base.

* * * * *